(12) United States Patent
Li et al.

(10) Patent No.: US 10,892,254 B2
(45) Date of Patent: Jan. 12, 2021

(54) DEFECT-TOLERANT LAYOUT AND PACKAGING FOR GAN POWER DEVICES

(71) Applicants: Zhanming Li, West Vancouver (CA); Guanhou Luo, Foshan (CN); Yue Fu, Coquitlam (CA); Wai Tung Ng, Thornhill (CA); Yan-Fei Liu, Kingston (CA)

(72) Inventors: Zhanming Li, West Vancouver (CA); Guanhou Luo, Foshan (CN); Yue Fu, Coquitlam (CA); Wai Tung Ng, Thornhill (CA); Yan-Fei Liu, Kingston (CA)

( * ) Notice: Subject to any disclaimer, the term of this patent is extended or adjusted under 35 U.S.C. 154(b) by 0 days.

(21) Appl. No.: 16/409,785

(22) Filed: May 11, 2019

(65) Prior Publication Data

US 2019/0378822 A1    Dec. 12, 2019

Related U.S. Application Data

(60) Provisional application No. 62/681,952, filed on Jun. 7, 2018.

(51) Int. Cl.
| | |
|---|---|
| *H01L 25/07* | (2006.01) |
| *H01L 23/00* | (2006.01) |
| *H01L 23/498* | (2006.01) |
| *H01L 23/544* | (2006.01) |
| *H01L 21/48* | (2006.01) |
| *H01L 25/00* | (2006.01) |

(52) U.S. Cl.
CPC ........ *H01L 25/072* (2013.01); *H01L 21/4853* (2013.01); *H01L 23/49844* (2013.01); *H01L 23/544* (2013.01); *H01L 24/48* (2013.01); *H01L 25/50* (2013.01); *H01L 2223/54433* (2013.01); *H01L 2224/48227* (2013.01); *H01L 2924/1033* (2013.01); *H01L 2924/13064* (2013.01); *H01L 2924/14252* (2013.01); *H01L 2924/15311* (2013.01); *H01L 2924/15313* (2013.01)

(58) Field of Classification Search
CPC ... H01L 25/072; H01L 25/50; H01L 21/4853; H01L 23/49844; H01L 23/544; H01L 24/48; H01L 2223/54433; H01L 2224/48227; H01L 2924/1033; H01L 2924/13064; H01L 2924/14252; H01L 2924/15311; H01L 2924/15313
See application file for complete search history.

(56) References Cited

U.S. PATENT DOCUMENTS

2006/0133124 A1*  6/2006  Gamini ................. H01L 22/22
                                                    365/51
2017/0032958 A1*  2/2017  Richardson ....... H01L 21/02057

* cited by examiner

*Primary Examiner* — Timor Karimy

(57) ABSTRACT

Use of gallium nitride (GaN) semiconductor material for power devices is challenging due to low yield caused by high defect density on the wafer. Device layout on the wafer, chip probing, and device packaging increase the yield of large area power devices. Device dies containing a plurality of lower-power sub-devices are used to achieve high power ratings, by connecting only functional sub-devices together in the package, while being tolerant of defective sub-devices by selectively excluding the defective sub-devices. The packages and methods are particularly relevant to GaN power switching devices such as high electron mobility transistors (GaN HEMT).

8 Claims, 6 Drawing Sheets

DEFECT-TOLERANT LAYOUT AND PACKAGING FOR GAN POWER DEVICES

RELATED APPLICATION

This application claims the benefit of the filing date of Application No. 62/681,952, filed on Jun. 7, 2018, the contents of which are incorporated herein by reference in their entirety.

FIELD

This invention relates generally to gallium nitride (GaN)-based power devices. More specifically, the invention relates to layout and packaging of GaN-based power devices

BACKGROUND

Wide bandgap (WBG) gallium nitride (GaN)-based power electronic devices are emerging as promising candidates for next generation high-efficiency power converters, owing to superior material properties such as high electric breakdown field, high electron saturation velocity, and high mobility in a readily-available heterojunction 2-D electron gas (2DEG) channel. By using such devices it is possible to achieve much higher power density and efficiency than when using devices based on silicon or gallium arsenide (GaAs).

Currently, several platforms are available including GaN on silicon, GaN on sapphire, and GaN on GaN. Regardless the substrate material used, a common challenge is the need to control for material defects that significantly limit device yield and affect the cost of production.

For co-packaging of conventional silicon-based devices such as IGBT and VDMOS, there is a need to remove any defective die from the co-package since the vertical structure of such power devices uses the substrate as the drain and they are normally biased at high voltage. Defective dies in the co-package would result in defective idle material being biased at high voltage, which might affect performance of neighboring normal dies in the co-package.

For GaN based material, a prior method for dealing with defective semiconductor GaN devices was based on a chip probe (CP) technique in which defective devices are detected and then removed from production. This simple approach results in low yield when device size (i.e., wafer area) is large because the probability of finding a defect-free large area device is small. Another prior approach was to use small area single device dies, and chip probe to select multiple good dies for co-packaging, such as in a TO220 package. A limitation of such multiple small die packaging is the higher complexity in bonding many good small dies together.

Current and power ratings of power devices depend on the die size. For example, a high power device such as one rated at 650 V, 60 A has a GaN die size of about 4×6 mm. If defect density of the wafer is high, the chance of such a large device containing a single defect is high. Therefore, the larger the die size, the lower the yield.

SUMMARY

According to one aspect of the invention there is provided a gallium nitride (GaN) power switching device, comprising: at least one die comprising a plurality of sub-devices, wherein each sub-device is a switching device; wherein only functional sub-devices in the at least one die are selectively connected together in a package to provide the power switching device; wherein the functional sub-devices are distinguishable from any defective sub-devices in the at least one die prior to packaging according to an identifying mark on the defective sub-devices.

In one embodiment, the GaN power switching device comprises a high electron mobility transistor (HEMT).

In one embodiment, the at least one die is rectangular and the sub-devices are isolated and arranged in a row or a column.

In one embodiment, the at least one die is packaged in a matrix form, wherein only functional sub-devices are selectively connected together in parallel by wire bonds to the source (S), gate (G), and drain (D) terminals of the functional sub-devices.

In one embodiment, the at least one die is packaged in a matrix form, wherein only functional sub-devices are selectively connected together in parallel by land grid array or ball grid array metal bumping to the source (S), gate (G), and drain (D) terminals of the functional sub-devices.

In one embodiment, the at least one die is rectangular and the plurality of sub-devices are each diamond-shaped, and each three of the diamond-shaped sub-devices are in a high-density hexagonal arrangement. In one embodiment, a defective sub-device is identified by a drain terminal nearest to the defective sub-device. In one embodiment, the at least one device die is packaged, wherein only functional sub-devices are selectively connected together in parallel by land grid array or ball grid array metal bumping to the source (S), gate (G), and drain (D) terminals of the functional sub-devices. In one embodiment, the identified drain terminal nearest to the defective sub-device is not bumped.

According to another aspect of the invention there is provided a method for making a gallium nitride (GaN) power switching device, comprising: preparing at least one die comprising a plurality of sub-devices, wherein each sub-device is a switching device; distinguishing functional sub-devices from any defective sub-devices in the at least one die; and packaging the at least one die by selectively connecting together in parallel only functional sub-devices in the at least one die; wherein the selectively connecting together in parallel only functional sub-devices in the at least one die provides the GaN power switching device.

In one embodiment, the method includes distinguishing functional sub-devices from defective sub-devices in the at least one die according to an identifying mark on defective sub-devices.

In various embodiments, the method includes using a chip probe technique to determine whether a sub-device is functional or defective.

In one embodiment, the GaN power switching device comprises a high electron mobility transistor (HEMT).

In one embodiment, the at least one die is rectangular and the sub-devices are isolated and arranged in a row. The method may comprise packaging the at least one die in a matrix form, wherein only functional sub-devices are selectively connected together in parallel by wire bonds to the source (S), gate (G), and drain (D) terminals of the functional sub-devices. In another embodiment, the method may comprise packaging the at least one die in a matrix form, wherein only functional sub-devices are selectively connected together in parallel by land grid array or ball grid array metal bumping to the source (S), gate (G), and drain (D) terminals of the functional sub-devices.

In one embodiment, the at least one die is rectangular and the plurality of sub-devices are each diamond-shaped, and each three of the diamond-shaped sub-devices are in a high-density hexagonal arrangement. A defective sub-device may be identified by identifying a drain terminal nearest to a defective sub-device. In one embodiment, the method may comprise packaging the at least one device die, wherein only functional sub-devices are selectively connected together in parallel by land grid array or ball grid array metal bumping to the source (S), gate (G), and drain (D) terminals of the functional sub-devices. In one embodiment, the identified drain terminal nearest to the defective sub-device is not bumped.

According to another aspect of the invention there is provided a single power HEMT device die containing multiple isolated smaller sub-device units of HEMT each with source, gate, and drain terminals. Each sub-device unit is tested during a chip-probing stage and defective sub-units are identified.

In one embodiment, single or a plurality of dies are arranged in a matrix form during packaging and wire bonding is used to selectively wire bond functional sub-device units.

In another embodiment, single or a plurality of dies are arranged in a matrix form for land grid array or ball grid array metal bumping, where drain and gate terminals of defective sub-device units are not bumped.

According to another aspect of the invention there is provided a single power HEMT device die containing multiple connected smaller sub-device units of HEMT each with source, gate, and drain terminals, arranged in a closed packaged hexagonal geometry wherein each sub-device unit has a diamond shape. Each sub-device unit is tested during a chip-probing stage and a drain contact nearest to a defective diamond-shaped sub-device unit is identified during chip-probing. In one embodiment, a single die or a plurality of dies are arranged in a matrix form for land grid array or ball grid array metal bumping where the drain contact nearest to the defective unit is not bumped.

BRIEF DESCRIPTION OF THE DRAWINGS

For a better understanding of the invention, and to show more clearly how it may be carried into effect, embodiments will be described, by way of example, with reference to the accompanying drawings, wherein.

DETAILED DESCRIPTION OF EMBODIMENTS

Figure 1:
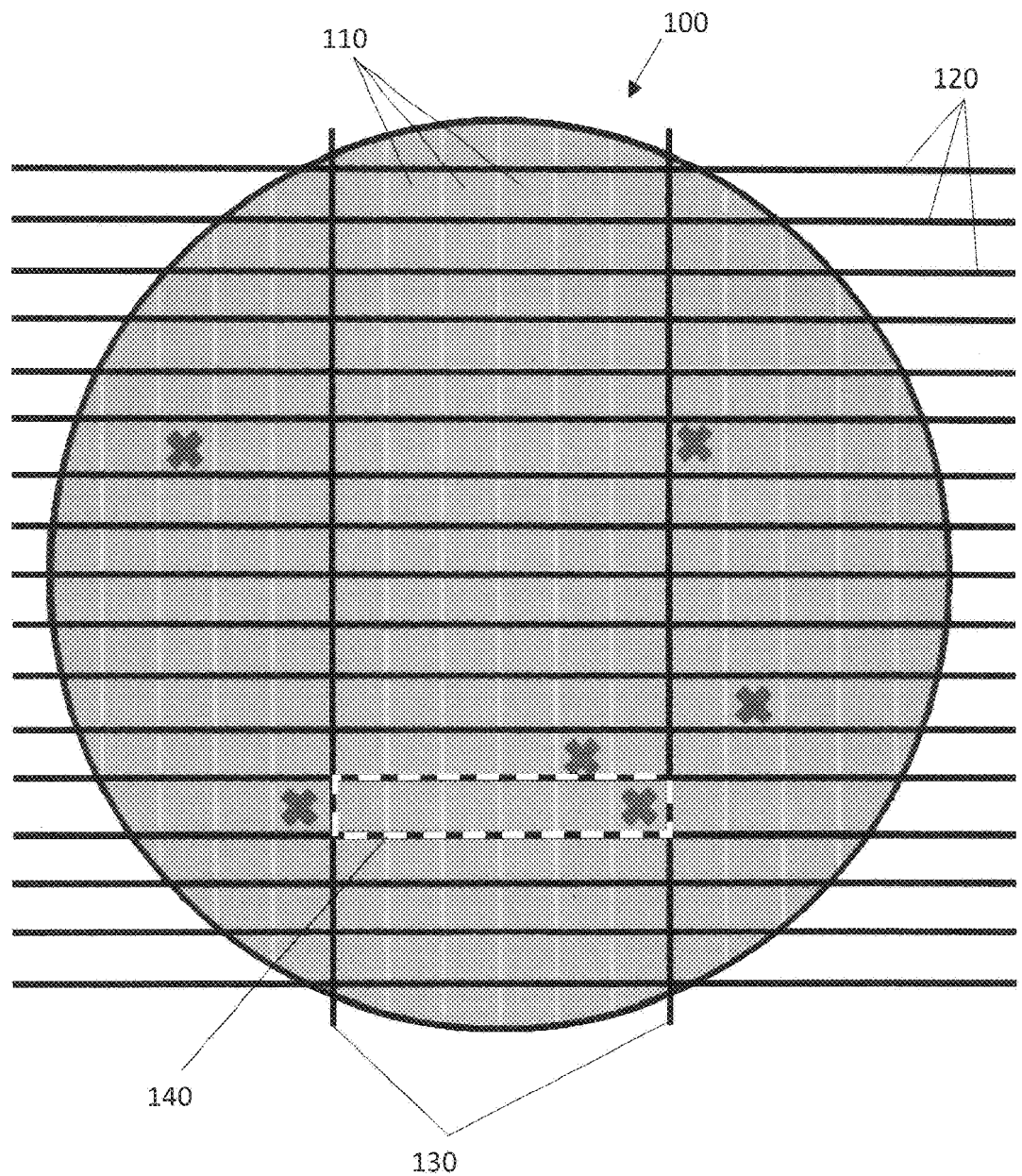
FIG. 1 is a diagram showing semiconductor dies on a wafer after chip probe (CP), wherein black lines indicate dicing cuts for individual dies and defective sub-devices are marked by an X label.

Use of GaN as a semiconductor material for power devices faces a challenge of low yield caused by high defect density on a wafer. Defects in the GaN epi-layer and imperfections in surface passivation and process flow can also lead to defective dies on a GaN wafer.

Since GaN transistors have parallel interdigitated fingers, the number of fingers is proportional to the device current rating. The total gate width of the gate fingers can be as large as tens of centimeters, while the total device area can be as large as tens of mm-squared. For high current, high power devices with a rating such as 650 V, 100 A, the device may take up a large portion of a reticle on the wafer and it may be difficult to find a device without a defect. For such a large area, the chance of a single die containing a defect is high. Since the interdigitated fingers are in parallel, a single defective finger would cause leakage or breakdown and thus destroy the entire device and result in waste of a large wafer area.

Embodiments of the invention provide device packages and packaging methods that increase the yield of large area power devices when defect density is high. The packages and methods use device dies containing a plurality of lower-power sub-devices which are connected together in parallel to achieve high power ratings, while being tolerant of defective sub-devices by selectively excluding the defective sub-devices. Embodiments provide for selectively excluding defective sub-devices by not electrically connecting the defective sub-devices with functional sub-devices during packaging. The packages and methods are particularly relevant to GaN power switching devices such as high electron mobility transistors (GaN HEMT).

According to one aspect of the invention, a high current die is implemented on a wafer by dividing the die into smaller sub-devices, and then, after identifying functional and defective sub-devices (e.g., by chip probe), connecting only the functional sub-devices together in parallel. In some embodiments, functional sub-devices are connected together in a unique matrix arrangement during the packaging stage, so that the overall yield is substantially increased.

As used herein, a "matrix" arrangement refers to the arrangement of sub-devices into rows and/or columns.

Defect-tolerant methods as described herein are especially suitable for lateral power devices such as GaN devices where the substrate is at low voltage or grounded and therefore the packaged device can tolerate unused/defective sub-devices which can be set at ground or low voltage. In addition, lateral devices are easy to isolate on wafer and on-wafer isolation is a standard method for monolithic integration for lateral devices.

In conventional vertical devices such as IGBT and VDMOS, the methods described herein are not possible since such vertical devices have the bottom substrate at high voltage (such as 650 V) and even if the technology allows good isolation, idle material at high voltage within the package is a liability. Thus, for vertical devices, the preferred approach is to identify and remove defective devices from the package completely.

FIG. 1 is a diagram showing an example of a wafer layout according to an embodiment of the invention. In this embodiment, the semiconductor wafer 100 is divided into multiple sub-devices 110 during wafer layout design. Defective sub-devices are identified using chip probe after wafer processing, and marked, such as with an "X", as indicated in FIG. 1. Any suitable technique for marking defective sub-devices may be used. Thus, functional sub-devices are identified by the lack of a mark, and defective sub-devices are identified by a mark. For example, a wafer layout design may be based on multiple 0.3 mm×0.3 mm isolated sub-devices each capable of carrying one ampere of current. Many other sizes and current ratings are of course possible, as they are a design choice. Each isolated sub-device is functional on its own (if not defective), that is, each sub-device has functional source (S), gate (G), and drain (D) terminals. The dark lines 120, 130 in FIG. 1 are wafer dicing lines. Thus, after dicing, each die contains multiple sub-devices 110, some of which might be defective, as marked. As an example, in FIG. 1, the die 140 indicated in dashed lines has six sub-devices, including one defective sub-device. It will be appreciated that a die may have tens or hundreds of sub-devices, depending on the design parameters. The dies may be used in a one-dimensional matrix package form, such as the embodiments shown in FIGS. 2, 3, 4, and 5.

Figure 2:
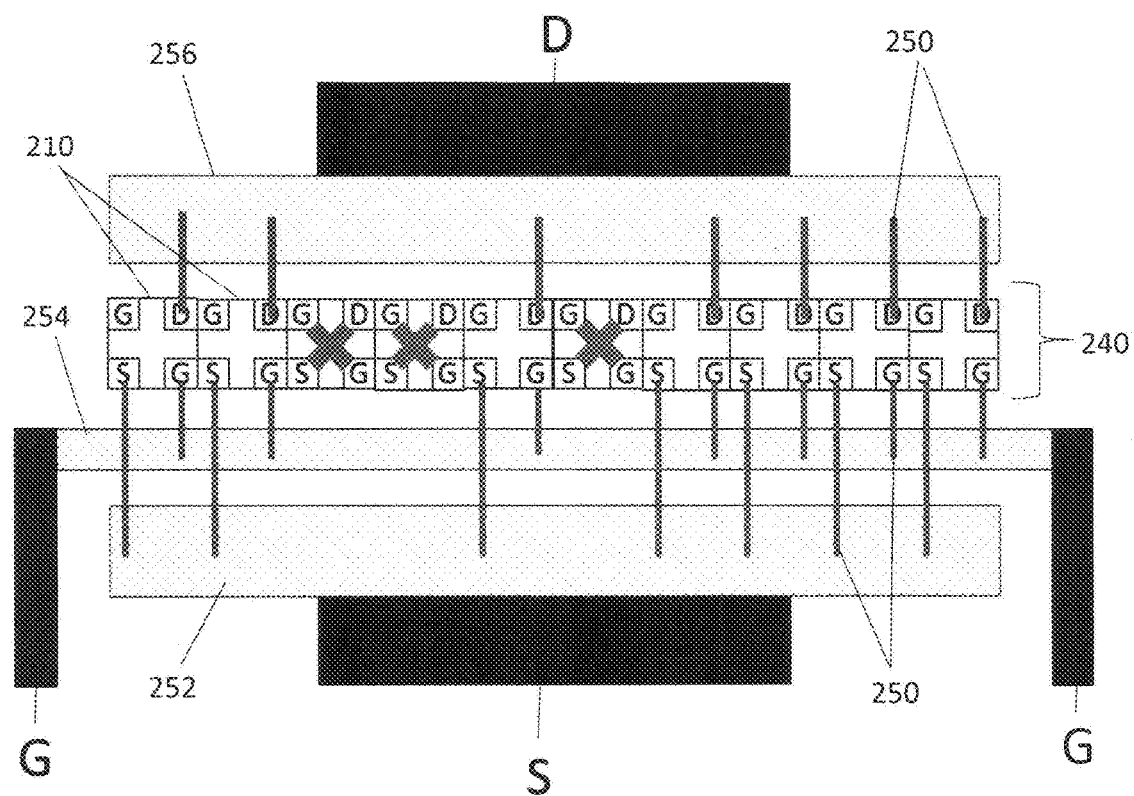
FIG. 2 is a diagram showing a one-dimensional matrix package of a single die including multiple sub-devices, wherein each sub-device has source (S), gate (G), and drain (D) terminals, according to one embodiment.

Referring to FIG. 2, a die 240 has ten sub-devices 210, including three defective sub-devices (marked with an X). Each sub device has S, G, and D terminals, and the S, G, and D terminals of functional sub-devices are connected via wire bonds 250 to respective traces 252, 254, 256, of the printed circuit board (PCB), which are connected to S, G, and D electrodes of the package.

Figure 3:
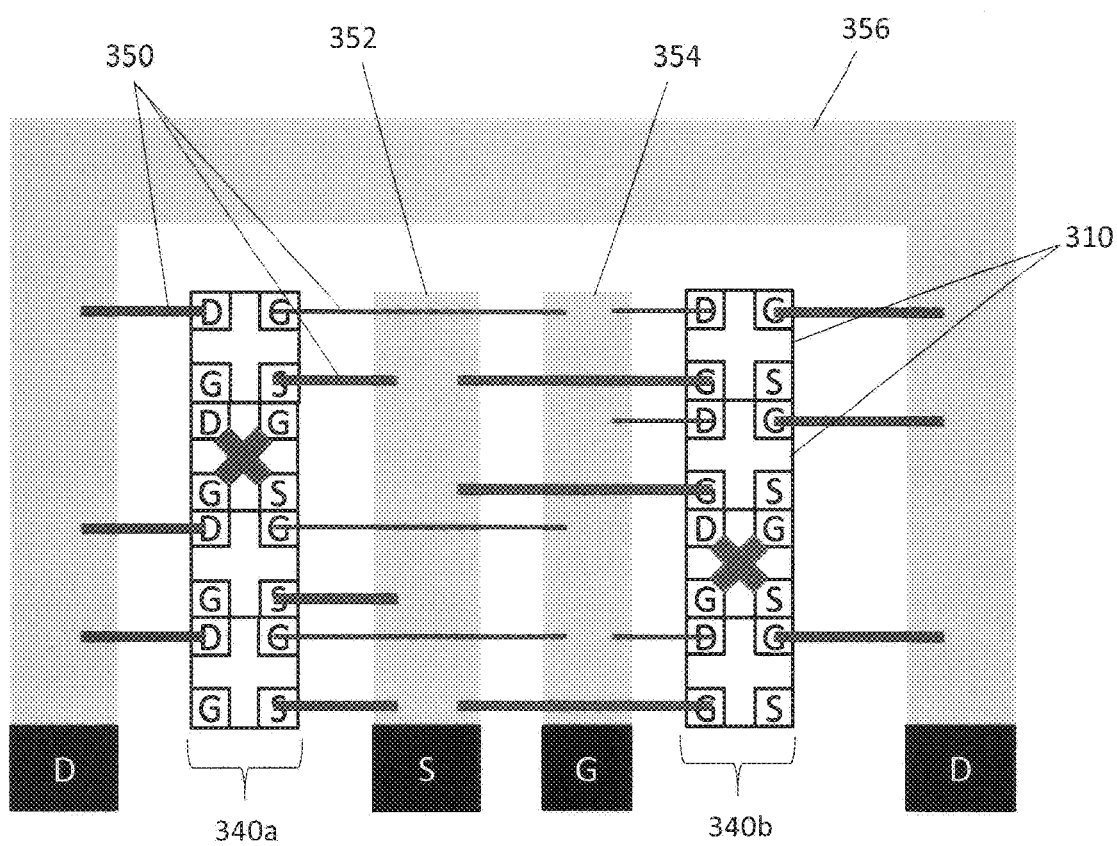
FIG. 3 is a diagram showing a folded one-dimensional matrix package of two dies each containing multiple sub-devices, wherein each sub-device has source (S), gate (G), and drain (D) terminals, according to one embodiment

To more effectively use the PCB area and increase packing density, a two-column matrix may be constructed, such as the embodiment shown in FIG. 3, by using an arrangement of interdigitated fingers of source 352 and drain 356 traces on the PCB. In this embodiment a single gate trace 354 is used to avoid crossing of the traces. In the embodiment of FIG. 3, two dies 340a, 340b are shown, each die including three functional sub-devices 310 and one defective sub-device. As in the embodiment of FIG. 2, bond wires 350 connect the S, G, and D terminals of the functional sub-devices to the respective traces on the PCB.

Figure 4:
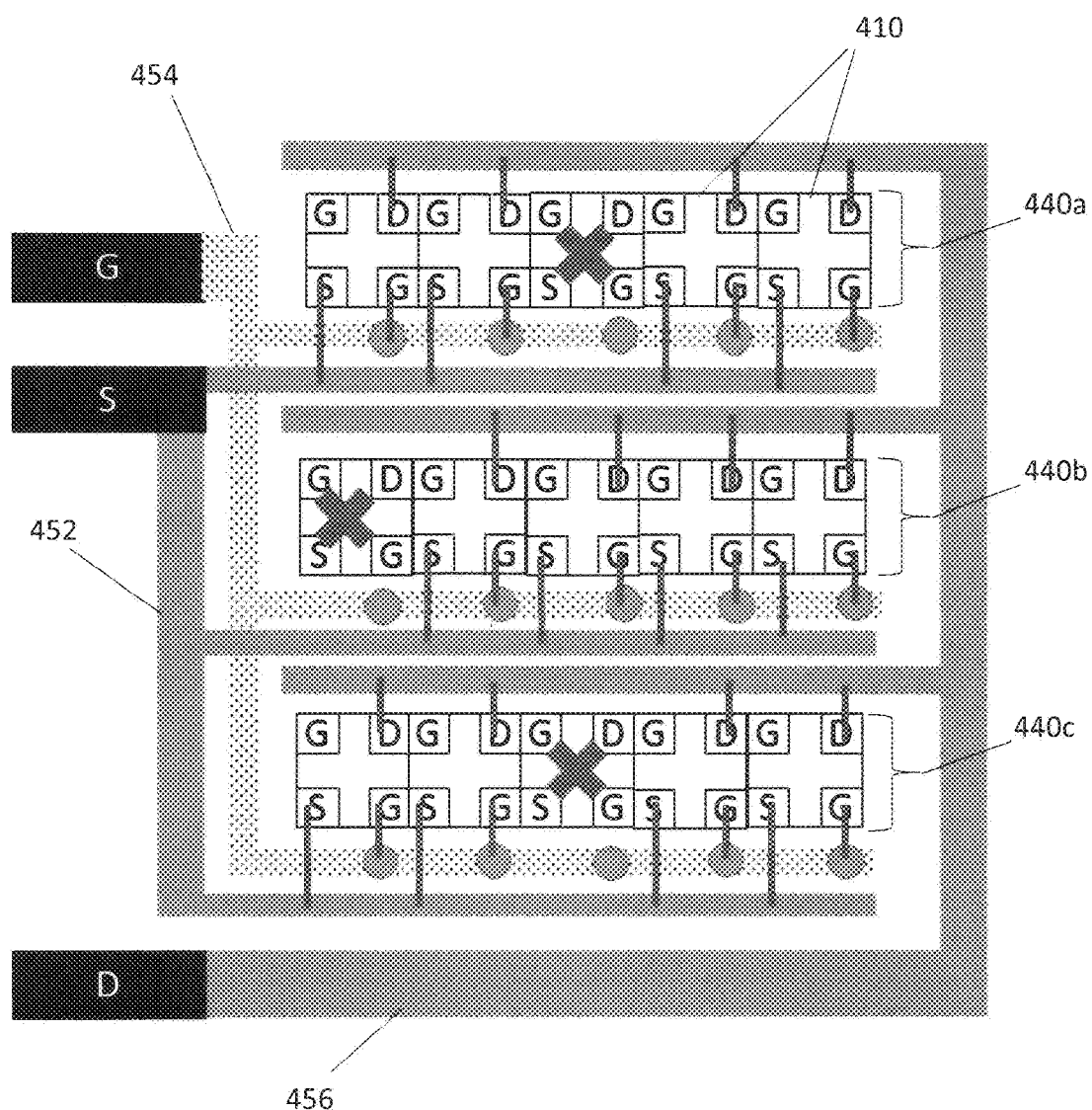
FIG. 4 is a diagram showing a package with an interdigitated arrangement of S and D electrodes and a G electrode provided through a second layer, wherein the package includes three dies, each die containing multiple sub-devices with S, G, and D terminals, and functional sub-devices are connected using wire bonding and defective sub-devices are marked with an X, according to one embodiment.
Figure 5:
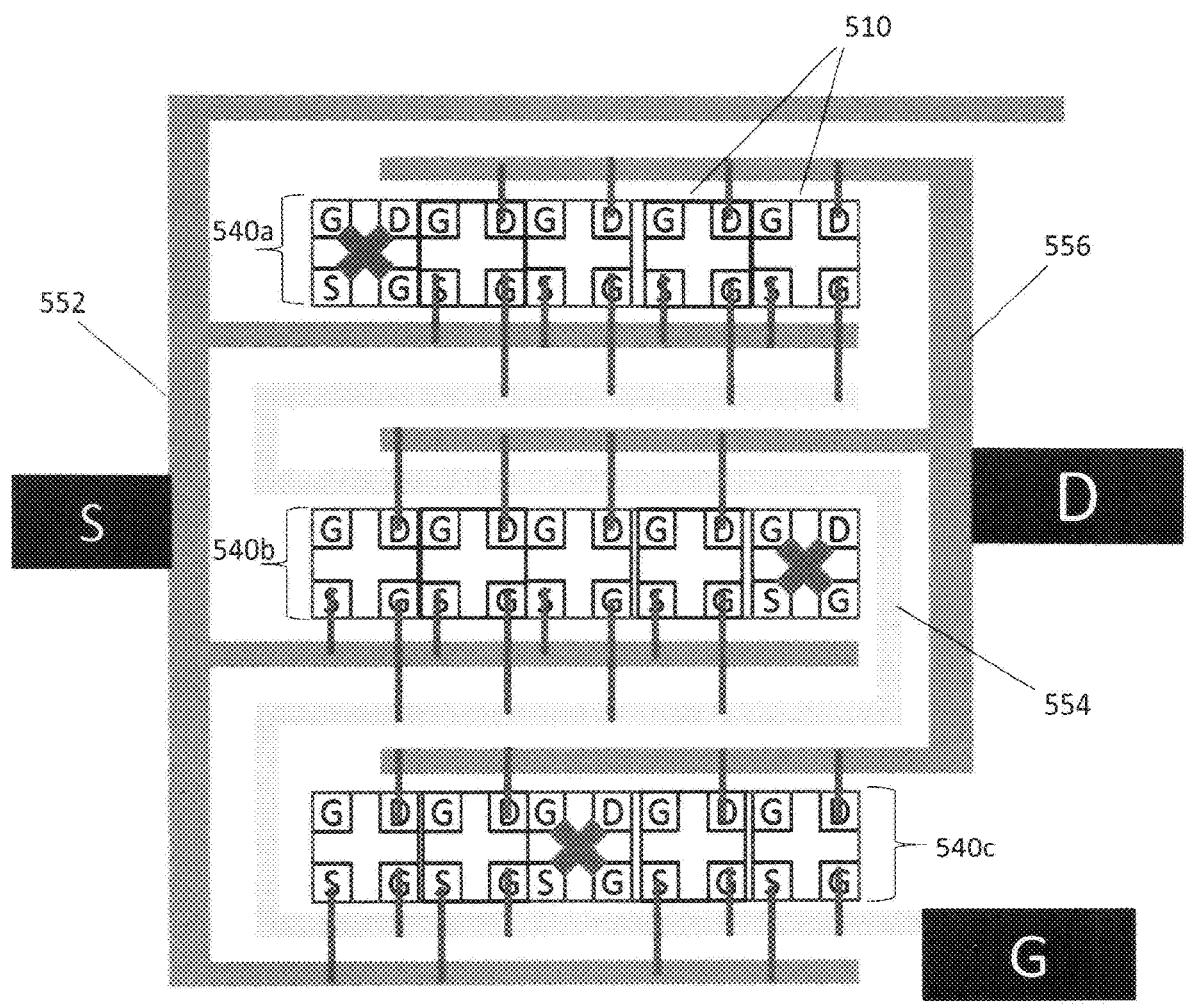
FIG. 5 is a diagram showing a package for three dies similar to the embodiment of FIG. 4, with an interdigitated arrangement of S and D electrodes and a G electrode provided as a separate trace on the printed circuit board (PCB) for wire bonding to G terminals of functional sub-devices on the three dies.

For a matrix arrangement with more columns, other interdigitated arrangements of the S, G, and D electrodes on the PCB may be used. Embodiments are shown in FIGS. 4 and 5. For example, in the embodiment of FIG. 4, three dies 440a, 440b, 440c are shown, each die having five sub-devices 410 including one defective sub-device. The metal trace 454 for the gate electrode is disposed on a different layer than the traces 452, 456 for source and drain electrodes, respectively, so that a more uniform gate bias can be achieved.

In the embodiment of FIG. 5, which also has three dies 540a, 540b, 540c, each die having five sub-devices 510 including one defective sub-device, a single gate trace 554 is disposed on the PCB running between the source 552 and drain 556 interdigitated fingers without crossing. This embodiment has the advantage of using only a single layer PCB, which reduces cost and complexity.

Figure 6:
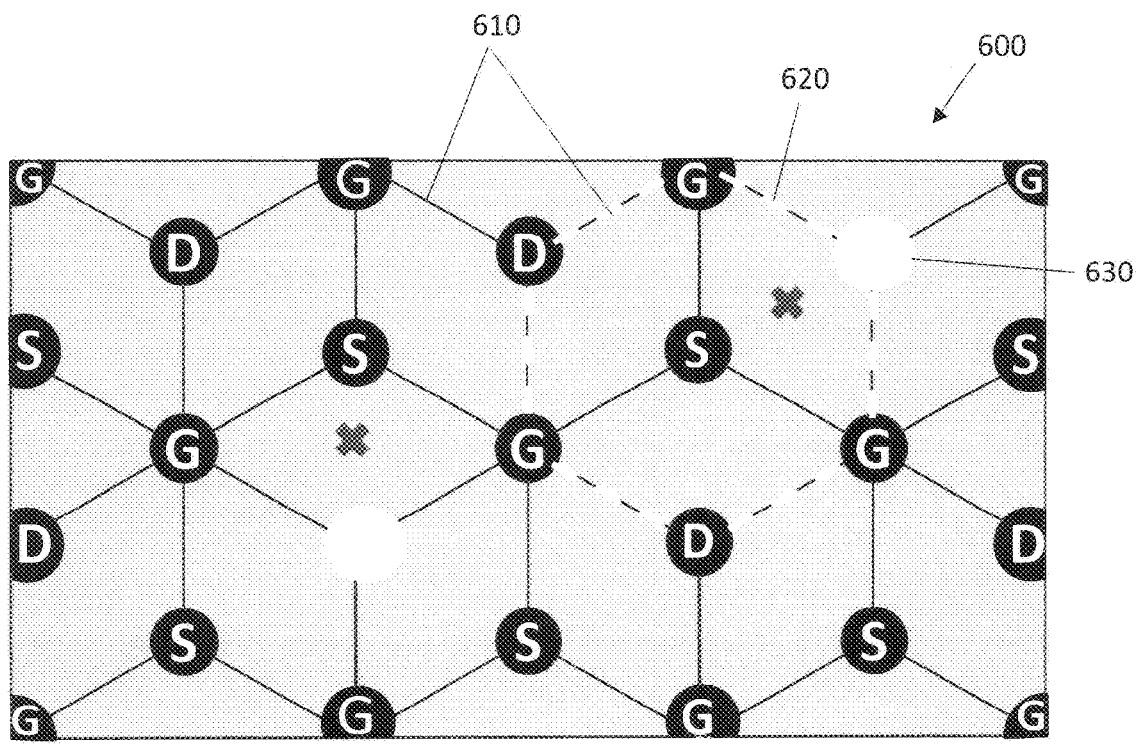
FIG. 6 is a diagram showing a GaN semiconductor die with sub-devices in a hexagonal arrangement, wherein land grid array metal bumping is applied to the S, G, and D terminals of the sub-devices in a flip-chip package, and wherein defective sub-devices are marked with an X, and D terminals near defective devices are not bumped.

In is noted that the defect-tolerant packaging methods described herein are compatible with other device layout designs. For example, U.S. application Ser. No. 15/859,502, filed on Dec. 30, 2017 describes a high density hexagonal device layout geometry. Such a hexagonal layout can be used with the defect-tolerant packaging methods described herein if the dies are diced in a rectangular shape. For example, in the embodiment of FIG. 6, a rectangular die 600 has multiple diamond-shaped sub-devices 610. Each hexagonal structure, an example of which is shown within dashed lines at 620, includes three sub-devices. Within the particular hexagonal structure shown at 620, there is one defective sub-device, marked with an X. If the rectangular die 600 is sufficiently small, packaging methods such as the examples shown in FIG. 2, FIG. 3, and FIG. 4 can be used without wire bonding lines crossing.

However, for such a hexagonal layout, the diamond shaped sub-devices cannot be isolated because S, G, and D terminals are shared by adjacent sub-devices. Therefore, during packaging, a different approach is required for connecting to the S, G, and D terminals of the sub-devices of the hexagonal layout.

For example, one option for the hexagonal layout is to use flip-chip packaging such as land grid array (LGA) or ball grid array (BGA), with two layers of metal traces on the PCB to resolve the line crossing issue. In such an embodiment, a drain terminal (typically high voltage, e.g., 650 V) of a defective sub-device is not metal bumped and not connected, as indicated by the blank terminal 630 in FIG. 6.

Figure 7:
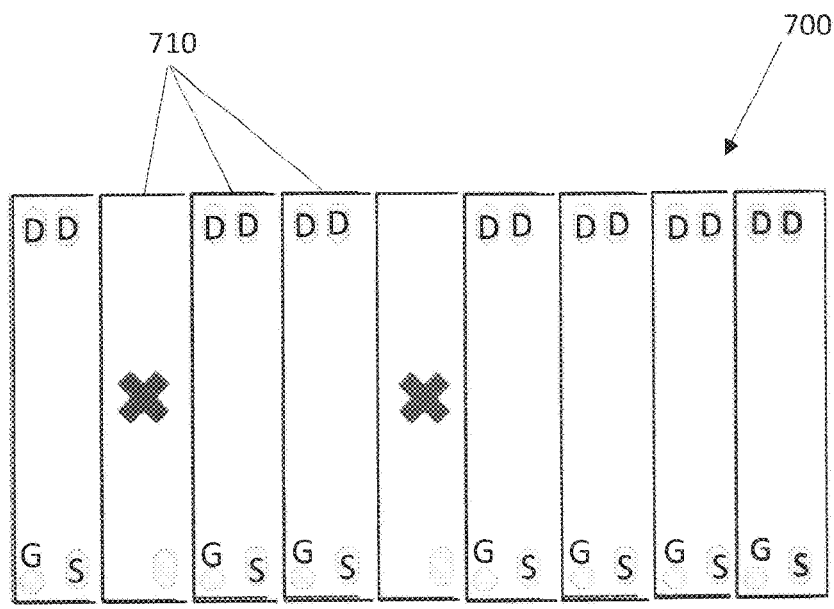
FIG. 7 is a diagram showing land grid array metal bumping of a single die containing multiple sub-devices, wherein defective sub-devices (marked with an X) are not bumped except for the source terminal.

FIG. 7 shows an embodiment of a rectangular die 700 designed for LGA/BGA GaN semiconductor layout. As in the rectangular die embodiments described above, a large area device is divided into multiple isolated sub-devices 710, each being a complete S, G, D unit. Defective sub-devices are identified after wafer processing and marked, such as shown with an X in FIG. 7. Subsequently, when making the metal bumping mask, the D and G contacts are ignored for bumping as indicated by blank areas in the defective sub-devices, as shown in FIG. 7.

The contents of all cited publications are incorporated herein by reference in their entirety.

EQUIVALENTS

While the invention has been described with respect to illustrative embodiments thereof, it will be understood that various changes may be made to the embodiments without departing from the scope of the invention. Accordingly, the described embodiments are to be considered merely exemplary and the invention is not to be limited thereby.

The invention claimed is:

1. A gallium nitride (GaN) power switching device, comprising:
   at least one die comprising a plurality of sub-devices, wherein each sub-device is a switching device;
   wherein only functional sub-devices in the at least one die are selectively connected together to provide the power switching device;
   wherein the functional sub-devices are distinguishable from any defective sub-devices in the at least one die prior to packaging according to an identifying mark on defective sub-devices;
   wherein the at least one die is rectangular and the plurality of sub-devices are each diamond-shaped, and each three of the diamond-shaped sub-devices are in a high-density hexagonal arrangement.

2. The GaN power switching device of claim 1, wherein a defective sub-device is identified by identifying a drain terminal nearest to the defective sub-device.

3. The GaN power switching device of claim 2, wherein the at least one die is packaged and only functional sub-devices are selectively connected together in parallel by land grid array or ball grid array metal bumping to the source (S), gate (G), and drain (D) terminals of the functional sub-devices.

4. The GaN power switching device of claim 3, wherein the identified drain terminal nearest to the defective sub-device is not bumped.

5. A method for making a gallium nitride (GaN) power switching device, comprising:
  preparing at least one die comprising a plurality of sub-devices, wherein each sub-device is a switching device;
  distinguishing functional sub-devices from any defective sub-devices in the at least one die according to an identifying mark on defective sub-devices; and
  packaging the at least one die by selectively connecting together in parallel only functional sub-devices in the at least one die;
  wherein the at least one die is rectangular and the plurality of sub-devices are each diamond-shaped, and each three of the diamond-shaped sub-devices are in a high-density hexagonal arrangement;
  wherein the selectively connecting together in parallel only functional sub-devices in the at least one die provides the GaN power switching device.

6. The method of claim 5, wherein a defective sub-device is identified by identifying a drain terminal nearest to the defective sub-device.

7. The method of claim 6, wherein only functional sub-devices are selectively connected together in parallel by land grid array or ball grid array metal bumping to the source (S), gate (G), and drain (D) terminals of the functional sub-devices.

8. The method of claim 7, wherein the identified drain terminal nearest to the defective sub-device is not bumped.

* * * * *